United States Patent [19]

Matsuura

[11] Patent Number: 4,551,820
[45] Date of Patent: Nov. 5, 1985

[54] DYNAMIC RAM INTEGRATED CIRCUIT DEVICE

[75] Inventor: Hiromi Matsuura, Kodaira, Japan

[73] Assignees: Hitachi, Ltd.; Hitachi Microcomputer Engineering, Ltd., both of Tokyo, Japan

[21] Appl. No.: 452,446

[22] Filed: Dec. 23, 1982

[30] Foreign Application Priority Data

Dec. 25, 1981 [JP] Japan .................................. 56-209397

[51] Int. Cl.$^4$ ............................................. G11C 11/40
[52] U.S. Cl. ....................................... 365/189; 365/210
[58] Field of Search ............... 365/174, 189, 149, 202, 365/205, 230, 210

[56] References Cited

U.S. PATENT DOCUMENTS

| | | | |
|---|---|---|---|
| 4,044,340 | 8/1977 | Itoh | 365/205 X |
| 4,045,783 | 8/1977 | Harland | 365/202 |
| 4,122,546 | 10/1978 | von Basse et al. | 365/189 |
| 4,371,956 | 2/1983 | Maeda et al. | 365/210 X |
| 4,476,547 | 10/1984 | Miyasaka | 365/205 |

OTHER PUBLICATIONS

Japanese Laid-Open Patent Application No. 148056/1974, Jun. 28, 1976.

*Primary Examiner*—Joseph A. Popek
*Attorney, Agent, or Firm*—Antonelli, Terry & Wands

[57] ABSTRACT

In a dynamic RAM having a memory array of a folded bit line arrangement, the memory array has a plurality of bit line pairs. A plurality of word lines and dummy word lines cross each of the bit line pairs so as to apply coupling noises of the same phase to the bit lines constituting each of the bit line pairs. The levels of the coupling noises applied to the bit lines constituting each of the bit line pairs, however, are also affected by the stray capacitance between the bit lines. Since the bit line disposed at an end part of the memory array has only one adjacent bit line disposed on one side thereof, only a relatively small stray capacitance is connected to the bit line. This causes the coupling noise between bit lines at the bit line disposed at an end part of the memory array to be different than the degree of coupling noise between other bit lines in the array. To overcome the unbalance this causes, an additional dummy bit line is disposed at an end part of the memory array in order to increase the stray capacitance connected to the bit line disposed at the end part of the memory array. Consequently, common mode noises at levels substantially equal to each other are applied to all the bit line pairs. A differential type sense amplifier connected to each of the bit line pairs does not respond to the common mode noise. Accordingly, the minute data signal set by a selected memory cell and a dummy memory cell in reading out data is amplified with substantially no deleterious effect being caused by noise.

24 Claims, 15 Drawing Figures

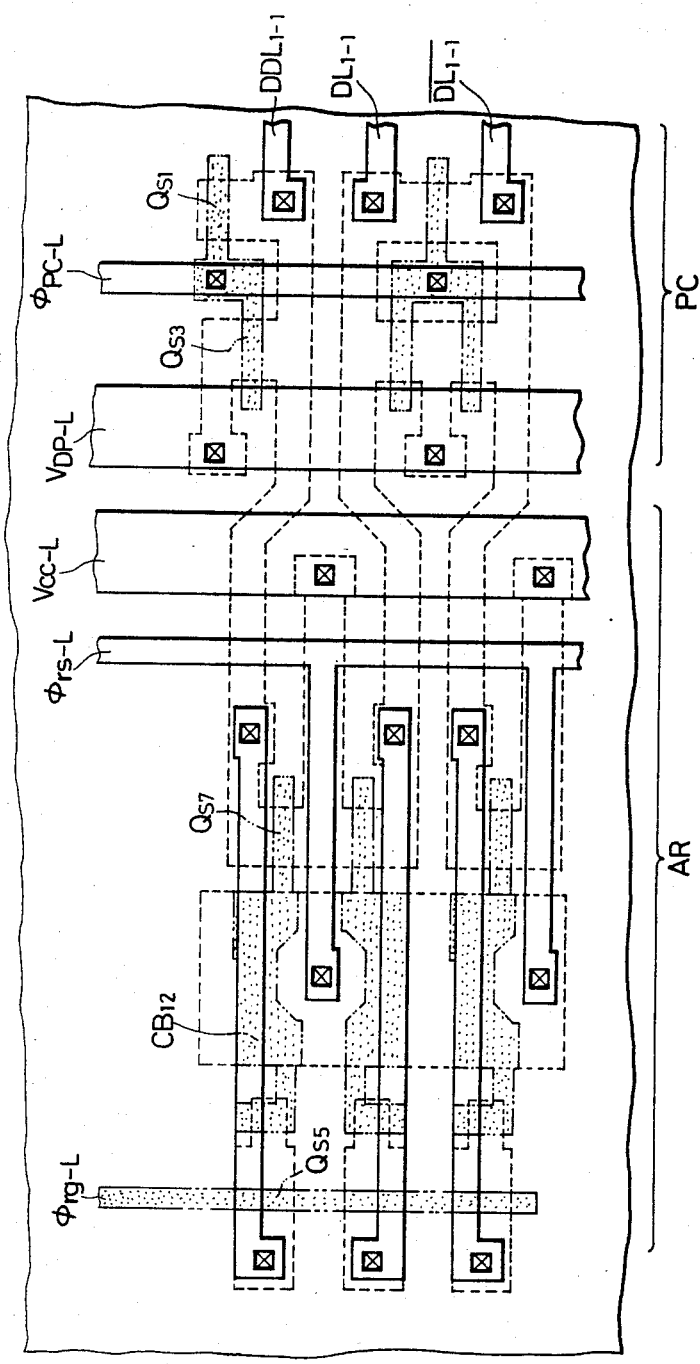

DYNAMIC RAM INTEGRATED CIRCUIT DEVICE

BACKGROUND OF THE INVENTION

The present invention relates to a D-RAM (dynamic random-access memory) integrated circuit device comprising MISFETs (metal insulator semiconductor field-effect transistors).

In a typical D-RAM, a memory array comprises a plurality of memory cells arranged in a matrix, data lines and word lines. In reading out data, a minute potential change is applied to a data line from a memory cell which is formed of a single transistor. In order to permit amplification of such a minute potential change, two data lines are paired in ordinary D-RAMs. When the stored data in the memory cell connected to one data line of such a data line pair is read out, a reference potential is applied to the other data line of the data line pair by a proper means such as a dummy cell. The potential difference between the lines constituting the data line pair is amplified by means of a sense amplifier.

In reading out data from the memory cells, a potential fluctuation which is considered to be noise is applied to each of the data lines from a word line through an undesirable capacitance such as a parasitic capacitor. It has been found in the past that the effect due to this potential fluctuation can be significantly reduced by means of a folded bit line arrangement. In other words, a single word line is made to smultaneously apply a noise which is considered to be a common mode noise to both the lines constituting the data line pair. The common mode noise can be substantially neglected by means of a differential type sense amplifier. Consequently, it becomes possible to read out data from the memory cells with substantially no error independently of the undesirable potential fluctuation applied to the data lines from the word line.

The inventor, however, has discovered through his further studies that a relatively large differential mode noise is applied to the data line pair located at an end part of the memory array even when such a folded bit line arrangement is used. This differential mode noise is produced due to the word line selecting operation and the substrate bias voltage fluctuation. Accordingly, although the folded bit line arrangement offers significant advantages, it still can have unresolved noise problems.

SUMMARY OF THE INVENTION Lp It is, therefore, an object of the present invention to provide a D-RAM integrated circuit device wherein coupling noises produced in the lines constituting a data line pair respectively owing to the word line selecting operation and the substrate bias voltage fluctuation are made substantially equal to each other.

In the D-RAM according to the present invention, a dummy data line is provided outside the outermost data line of the data lines, the dummy data line having the same arrangement as the above-mentioned data lines. As a result, it is possible to equalize the composite parasitic capacitances between data lines with each other. Consequently, coupling noises from the word lines and dummy word lines and the coupling noises due to the fluctuation in the substrate bias voltage $-V_{BB}$ are produced equally in the lines constituting each data line pair. Accordingly, it is possible to cancel out the coupling noises produced in the lines constituting a data line pair respectively by means of a differential type sense amplifier provided to each data line pair.

Thus, it is possible to prevent malfunctioning and increase the input level margin, since the minute voltage difference fed to the differential type sense amplifier is not affected by the above-mentioned coupling noises.

BRIEF DESCRIPTION OF THE DRAWINGS

FIG. 4D shows a layout pattern of another example of a part of the sense amplifier;

DESCRIPTION OF THE PREFERRED EMBODIMENT

Prior to the description of the present invention, a D-RAM integrated circuit having a folded bit line arrangement previously examined by the inventor will be described hereinunder to facilitate a better understanding of the invention.

Figure 1:
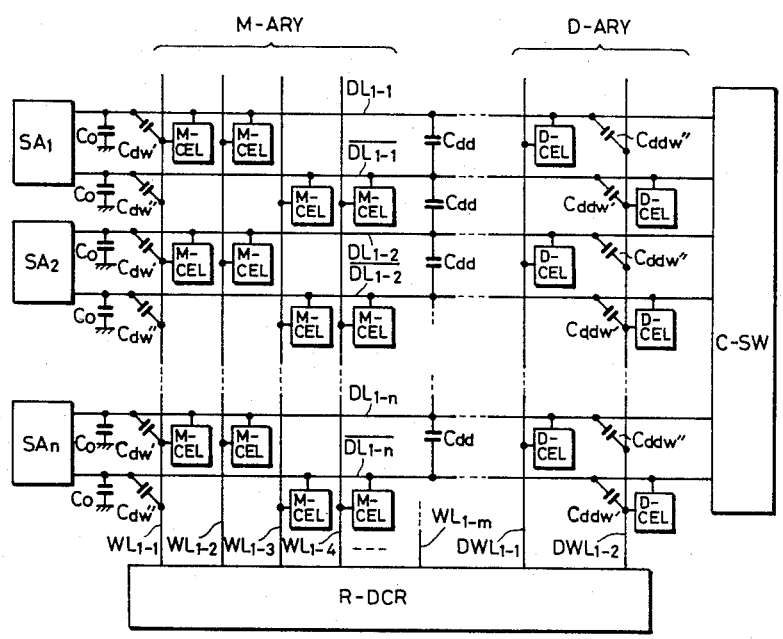
FIG. 1 is a block diagram of a D-RAM circuit previously examined by the inventor which illustrates the source of a malfunction problem discovered by the inventor.

FIG. 1 is a block diagram of a circuit showing a part of the folded bit line arrangement D-RAM previously examined by the inventor. The D-RAM has a memory array comprising a plurality of memory cells M-CEL arranged in a matrix, dummy cells D-CEL, data lines $DL_{1-1} \sim \overline{DL_{1-n}}$, word lines $WL_{1-1} \sim WL_{1-m}$ and dummy word lines $DWL_{1-1}$, $DWL_{1-2}$. Each memory cell consists of a single transistor cell and has an input/output terminal connected with a data line and a selection terminal connected with a word line. Each data line pair, e.g., $DL_{1-1}$ and $\overline{DL_{1-1}}$, is connected with input/output terminals of a differential type sense amplifier such as $SA_1$.

An outline of the data reading-out operation in the D-RAM is as follows.

First, the potential of a word line to be selected, e.g., the word line $WL_{1-1}$, and the potential of the dummy word line $DWL_{1-2}$ corresponding thereto are simultaneously changed from low levels to high levels, respectively. When the potential of the word line $Wl_{1-1}$ is a high level, the memory cells M-CEL in the first row, whose selection terminals are connected with the word line $WL_{1-1}$, are selected. Consequently, the potential of each of the data lines $DL_{1-1}$, $DL_{1-2}$, ..., previously set at a proper initial value, ischanged to a voltage corresponding to the data, "1" or "0", previously stored in the memory cells selected by means of the word line $WL_{1-1}$.

At the same time, the dummy cells D-CEL in the second row, whose selection terminals are connected with the dummy word line $DWL_{1-2}$, are selected. Consequently, the initial voltage of each of the data lines $\overline{DL_{1-1}}$, $\overline{DL_{1-2}}$ ..., $\overline{DL_{1-n}}$ is changed to a given reference voltage.

As a result, a minute voltage difference with a polarity corresponding to the data previously stored in the selected memory cells is applied between the lines constituting each of the data line pairs, e.g., $DL_{1-1}$ and $\overline{DL_{1-1}}$. The minute voltage difference applied to each of the data line pairs is amplified until it becomes a sufficiently large voltage difference by means of the corresponding one of the differential type sense amplifiers $SA_1$, $SA_2$, ..., $SA_n$ provided for each of the respective data line pairs.

Next, a data line pair is selected from the plurality of data line pairs by means of a column switch C-SW. The signal on the selected data line pair is transmitted to the outside of the D-RAM through a data output buffer DOB, not shown. In this manner, the data stored in any memory cell can be read out.

The selection of the word lines and the dummy word lines is carried out by means of a row decoder circuit R-DCR, while the column switch is controlled by means of a column decoder circuit D-DCR, not shown.

Each of the word lines $WL_{1-1}$, $WL_{1-2}$, ..., $WL_{1-m}$ and the dummy word lines $DWL_{1-1}$, $DWL_{1-2}$ cross all the data lines $DL_{1-1}$, $\overline{DL_{1-1}}$, ..., $DL_{1-n}$, $\overline{DL_{1-n}}$ in an actual device structure. A parasitic capacitance between a data line and a word line, $C_{dw}'$ or $C_{dw}''$ ($C_{dw}' < C_{dw}''$), is formed at each of intersections between the word lines and the data lines. The parasitic capacitance $C_{dw}'$ between a data line and a word line substantially represents the parasitic capacitance formed at the intersections where memory cells are disposed. On the other hand, the parasitic capacitance $C_{dw}''$ between a data line and a word line represents the parasitic capacitance formed at intersections where memory cells are not disposed.

Including the gate-drain capacitance of a switch MISFET, not shown, in each memory cell M-CEL, the parasitic capacitance $C_{dw}'$ has a capacitance value larger than that of the parasitic capacitance $C_{dw}''$ which is formed simply due to the crossed wiring structure. Because of these shown parasitic capacitances $C_{dw}'$, $C_{dw}''$, a coupling noise is applied to each data line when the potential of a word line rises from a low level to a high level.

It is expected in the folded bit line arrangement D-RAM that the coupling noise applied to each line of a data line pair from a word line and a dummy word line will be a common mode noise. Therefore, the noises applied to the lines constituting data line pairs, respectively, are expected to be substantially neglected by a differential type sense amplifier.

For instance, when the word line $WL_{1-1}$ is selected, a coupling noise is applied to the data line $DL_{1-1}$ from a word line $WL_{1-1}$ through the parasitic capacitance $C_{dw}'$. At the same time, a coupling noise is applied to the data line $\overline{DL_{1-1}}$ from the word line $WL_{1-1}$ through the parasitic capacitance $C_{dw}''$. Also at thistime, since the dummy word line $DWL_{1-2}$ is also selected correspondingly to the word line $WL_{1-1}$, a coupling noise is also applied to each of the data lines $DL_{1-1}$, $\overline{DL_{1-1}}$ from the dummy word line. Therefore, it is considered that the parasitic capacitance between, e.g., the data line $DL_{1-1}$ and the selected word line $WL_{1-1}$ and the parasitic capacitance between the data line $DL_{1-1}$ and the dummy word line $DWL_{1-2}$ substantially constitute a single composite parasitic capacitance which applies a coupling noise to the data line $DL_{1-1}$.

If the parasitic capacitance $C_{ddw}''$ formed between the dummy word line $DWL_{1-2}$ and the data line $DL_{1-1}$ is made equal to the parasitic capacitance $C_{dw}''$ formed between the word line $WL_{1-1}$ and the data line $\overline{DL_{1-1}}$, and if the parasitic capacitance $C_{ddw}'$ formed between the dummy word line $DWL_{1-2}$ and the data line $\overline{DL_{1-1}}$ is made equal to the parasitic capacitance $C_{dw}'$ formed between the word line $WL_{1-1}$ and the data line $DL_{1-1}$, the composite parasitic capacitance $(C_{dw}' + C_{ddw}'' = C_{dw})$ connected to the data line $DL_{1-1}$ when the word line $WL_{1-1}$ is selected becomes equal to the composite parasitic capacitance $(C_{dw}'' + C_{ddw}' = C_{dw})$ connected to the data line $\overline{DL_{1-1}}$. As a result, it is expected that the noise applied to the data line $DL_{1-1}$ when the word line $WL_{1-1}$ is selected will have a level substantially equal to that of the noise applied to the data line $\overline{DL_{1-1}}$. Moreover, it is expected that the noise applied to each of the data line pairs $DL_{1-1}$ and $\overline{DL_{1-1}}$ is neglected by the differential type sense amplifier $SA_1$ because the noise is substantially a common mode noise.

As noted above, however, the inventor has found that the noise applied to one of the lines constituting a data line pair, e.g., $DL_{1-1}$, disposed at an end part of the memory array does not excellently coincide with the noise applied to the other of the lines constituting the data line pairs, i.e., $\overline{DL_{1-1}}$. In other words, the data lines $DL_{1-1}$, $\overline{DL_{1-1}}$, ..., $DL_{1-n}$, $\overline{DL_{1-n}}$ in the D-RAM are formed from, e.g., the same wiring layer and arranged adjacently to each other at substantially equal distances. Accordingly, a parasitic capacitance between data lines $C_{dd}$ having a value which cannot be neglected is formed between data lines adjacent to each other.

In FIG. 1, the parasitic capacitance between data lines connected with each of the data lines disposed inside the memory array, i.e., each of the data lines other than the data lines $DL_{1-1}$ and $\overline{DL_{1-n}}$ disposed at the end parts of the memory array respectively, is $2C_{dd}$ because the parasitic capacitance has data lines disposed on both sides thereof. On the other hand, the parasitic capacitance between data lines connected with each of the data lines $DL_{1-1}$ and $\overline{DL_{1-n}}$ disposed at the end parts of the memory array respectively is $C_{dd}$ because the parasitic capacitance has only one data line disposed on one side thereof.

Consequently, the coupling noises applied to the data line pair $DL_{1-1}$ and $\overline{DL_{1-1}}$ disposed at an end part of the memory array respectively are not equal to each other. Similarly, the coupling noises applied to the data line pair at the lowermost end part, respectively, are not equal to each other.

Particularly, when the elements are made smaller with the need for increasing the memory capacitance, i.e., for making the memory array density higher, the parasitic capacitance $C_{dd}$ in the same wiring layer becomes larger. Therefore, the unbalance between the coupling noises produced in the above-mentioned data line pair becomes larger and larger.

When the potential of each of a word line and a dummy word line rises from a low level (0 V) to a high level ($V_{cc}$) in the D-RAM, the approximate values of the coupling noises (voltage varying quantities) $\Delta V_N$, $\Delta V_N'$ applied to the data line pair ($DL_{1-1}$, $\overline{DL_{1-n}}$) by the effects of the composite parasitic capacitance $C_{dw}'$ between a data line and a word line, the parasitic capacitance $C_{dd}$ between data lines, and the other parasitic capacitance $C_O$ of the data line are obtained according to the following equations (1), (2):

$$\Delta V_N = \frac{C_{dw}}{C_{dw} + C_O + C_{dd}} V_{cc} \quad (1)$$

$$\Delta V_N' = \frac{C_{dw}}{C_{dw} + C_O + 2C_{dd}} V_{cc} \quad (2)$$

It is to be also noted that the parasitic capacitance $C_O$ includes the junction capacitance between the drain of the MISFET constituting a memory cell and a substrate. Accordingly, the fluctuation in the substrate bias voltage $-V_{BB}$ applied to the substrate causes similar coupling noises to be generated in the data lines.

Also in this case, coupling noises to be unbalanced are generated in the outermost pair data lines $DL_{1-1}$, $\overline{DL_{1-1}}$ and $DL_{1-n}$, $\overline{DL_{1-n}}$. Thus, if coupling noises are not equally generated in the lines constituting a data line pair, a differential type sense amplifier fed with the signal on the data line pair as an input signal easily malfunctions. Consequently, when the data stored in a memory cell appears on a data line pair in the form of a minute voltage difference, coupling noises may cause the minute voltage difference to decrease. Thus, the noise margin of the signal to be detected may lower to such an extent that the degree of this decrease cannot be disregarded.

Such a problem occurs, for example, when a signal corresponding to the data "0" stored in a memory cell is read out to the uppermost end data line $DL_{1-1}$. In this case, the voltage of the data line $DL_{1-1}$ is lower than the voltage (reference voltage) of the data line $\overline{DL_{1-1}}$ paired therewith.

As is apparent from the equations (1) and (2), however, the coupling noise generated in the uppermost end data line $DL_{1-1}$ is larger than that generated in the data line $\overline{DL_{1-1}}$ paired therewith. Consequently, the minute voltage difference between the data lines $DL_{1-1}$, $\overline{DL_{1-1}}$ decreases owing to the unbalance between the coupling noises.

This kind of problem also occurs in the following cases:

(A) When the signal corresponding to the data "0" stored in a memory cell is read out to the lowermost end data line $\overline{DL_{1-n}}$.

(B) When the signal corresponding to the data "1" stored in a memory cell is read out to the data line $\overline{DL_{1-1}}$ or $DL_{1-n}$.

Figure 2A:
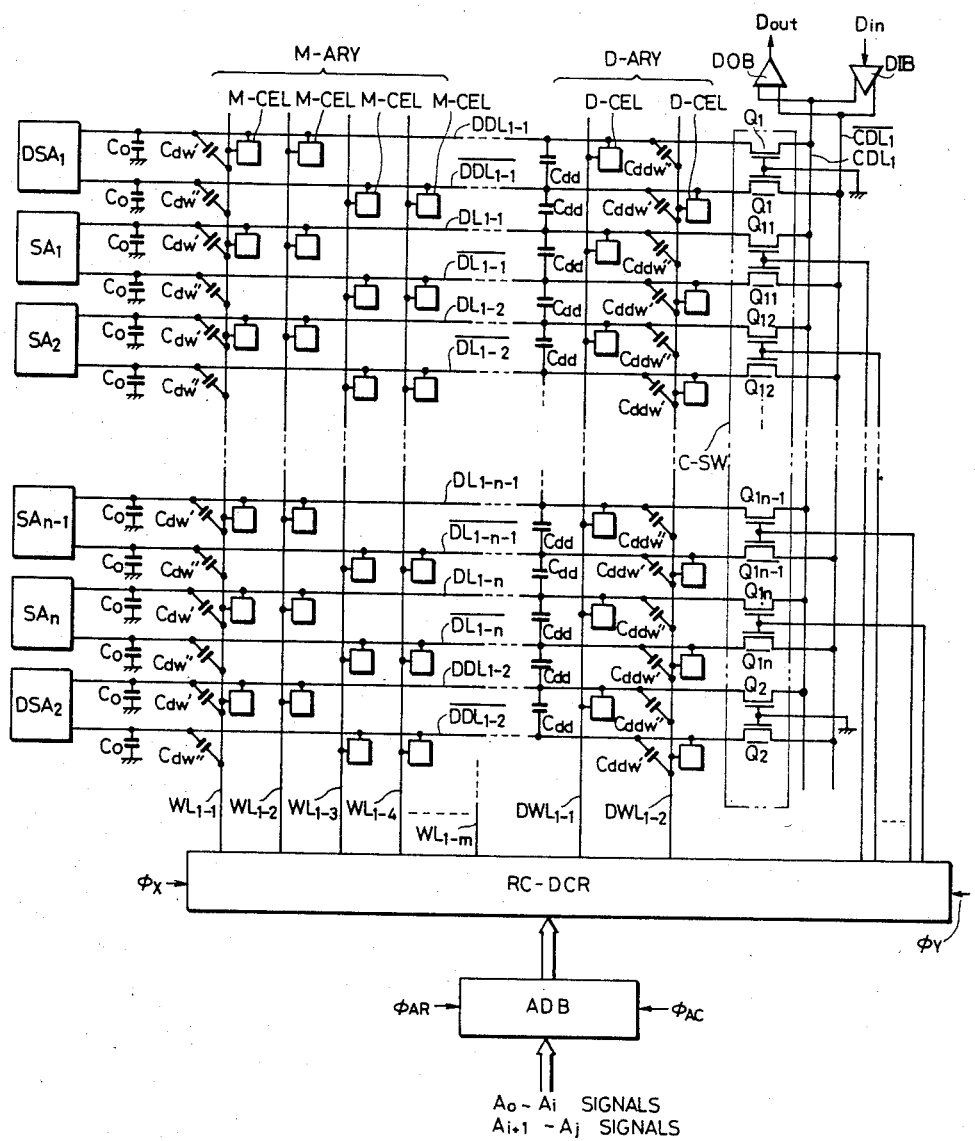
FIG. 2A is a block diagram of an example of a circuit constituting an essential part of a D-RAM constructed in accordance with a first embodiment of the present invention.

A preferred embodiment of the present invention will be described hereinunder in greater detail. FIG. 2A is a block diagram of an example of a circuit constituting an essential part of the present invention.

Sense amplifiers $SA_1$, $SA_2$, ..., $SA_n$ are provided to data line pairs $DL_{1-1}$, $\overline{DL_{1-1}}$; $DL_{1-2}$, $\overline{DL_{1-2}}$; ...; $DL_{1-n}$, $\overline{DL_{1-n}}$ respectively. Each of the data lines $DL_{1-1}$, $\overline{DL_{1-1}}$, ..., $\overline{DL_{1-n}}$ is connected with the input/output terminals of memory cells M-CEL provided under a given matrix and dummy cells D-CEL respectively. Moreover, word lines $WL_{1-1}$, $WL_{1-2}$, ..., $WL_{1-m}$ and dummy word lines $DWL_{1-1}$, $DWL_{1-2}$ are provided so as to cross the data lines at rightangles. Each of the word and dummy word lines is connected with the selection terminals of the memory cells M-CEL provided under a given matrix and the dummy cells D-CEL respectively. The data line pairs $DL_{1-1}$, $\overline{DL_{1-1}}$; $DL_{1-2}$, $\overline{DL_{1-2}}$; ...; $DL_{1-n}$, $\overline{DL_{1-n}}$ are connected with a pair of common data lines $CDL_1$, $\overline{CDL_1}$ through pairs of MISFETs $Q_{11}$, $\overline{Q_{11}}$; $Q_{12}$, $\overline{Q_{12}}$; ...; $Q_{1n}$, $\overline{Q_{1n}}$ for constituting a column switch C-SW respectively. The common data lines $CDL_1$, $\overline{CDL_1}$ are connected with the input terminal of a data output buffer DOB and the output terminal of a data input buffer DIB, respectively. The signal transmission and reception between the D-RAM and an external circuit, i.e., the transmission of the read-out data and the data to be written, takes place through the data output buffer DOB and the data input buffer DIB.

A row-column decoder RC-DCR performs the selecting operation for selecting a word line and a dummy word line from the word lines $WL_{1-1}$, $WL_{1-2}$, ..., $WL_{1-m}$ and the dummy word lines $DWL_{1-1}$, $DWL_{1-2}$. Moreover, the row-column decoder RC-DCR performs the selecting operation for selecting a pair of MISFETs from the pairs of MISFETs $Q_{11}$, $\overline{Q_{11}}$; $Q_{12}$, $\overline{Q_{12}}$; ...; $Q_{1n}$, $\overline{Q_{1n}}$.

An address buffer ADB processes two kinds of multiplexed external address signals, i.e., row address signals $A_0 \sim A_7$ and column address signals $A_8 \sim A_{15}$. In particular, the buffer ADB processes these signals into pairs of cmplementary address signals ($a_0$, $\overline{a_0}$)$\sim$($a_7$, $\overline{a_7}$) and ($a_8$, $\overline{a_8}$)$\sim$($a_{15}$, $\overline{a_{15}}$), respectively, and sends them to the row-column decoder RC-DCR at timings $\phi_{AR}$, $\phi_{AC}$ in accordance with the operation in the IC chip.

The row-column decoder RC-DCR decodes the pairs of complementary address signals for performing the above-mentioned selecting operation.

In the example, pairs of dummy data lines $DDL_{1-1}$, $\overline{DDL_{1-1}}$ and $DDL_{1-2}$, $\overline{DDL_{1-2}}$ are provided in order to eliminate the above-described nonuniformity in the parasitic capacitance between the lines constituting a data line pair $DL_{1-1}$, $\overline{DL_{1-1}}$ disposed at the uppermost end of the memory array part M-ARY (or the dummy array part D-ARY) and between the lines constituting a data line pair $DL_{1-n}$, $\overline{DL_{1-n}}$ disposed at the lowermost end thereof.

The pair of dummy data lines $DDL_{1-1}$, $\overline{DDL_{1-1}}$ is provided above the uppermost data line pair $DL_{1-1}$, $\overline{DL_{1-n}}$ under the same arrangement as the other data lines.

On the other hand, the pair of dummy data lines $DDL_{1-n}$, $\overline{DDL_{1-n}}$ is provided below the lowermost end data line pair $DL_{1-n}$, $\overline{DL_{1-n}}$ under the same arrangement as the other data lines.

In order to make its parasitic capacitance $C_O$ equal to that of the data lines $DL_{1-1}$, $DL_{1-2}$, ..., $DL_{1-n}$ each of these dummy data lines $DDL_{1-1}$, $\overline{DDL_{1-1}}$, $DDL_{1-2}$, $\overline{DDL_{1-2}}$ is connected with a plurality of memory cells M-CEL, a single dummy memory cell D-CEL, a dummy sense amplifier $DSA_1$ or $DSA_2$ and the corresponding one of MOS transistors $Q_1$, $\overline{Q_1}$, $Q_2$ and $\overline{Q_2}$ for forming a column switch, as shown in the figure.

The practical arrangement of each of the dummy sense amplifiers $DSA_1$, $DSA_2$ is to be the same as the sense amplifiers $SA_1$, $SA_2$, ..., $SA_n$. In addition, each of the word lines is formed so as to cross the dummy data lines in order to make the parasitic capacitance $D_{dw}$ between a data line and a word line of each dummy data line equal to that of the other data lines.

The pair of dummy data lines is provided in order to make the parasitic capacitance between data lines of the outermost data lines $DL_{1-1}$ and $\overline{DL_{1-n}}$ respectively equal to that of the other data lines. i.e., $2 C_{dd}$. Therefore, it is unnecessary to read out the data in a pair of dummy data lines. Accordingly, the pairs of MOS transistors $Q_1$, $\overline{Q_1}$ and $Q_2$, $\overline{Q_2}$ for forming a column switch connected with the pairs of dummy data lines $DDL_{1-1}$, $\overline{DDL_{1-1}}$ and $DDL_{1-2}$, $\overline{DDL_{1-2}}$ respectively are maintained in an OFF state. This can be carried out, as shown in FIG. 2A, by coupling the gates of the transistors $Q_1$, $\overline{Q_1}$, $Q_2$ and $\overline{Q_2}$ to ground.

Figures 2B, 2C:
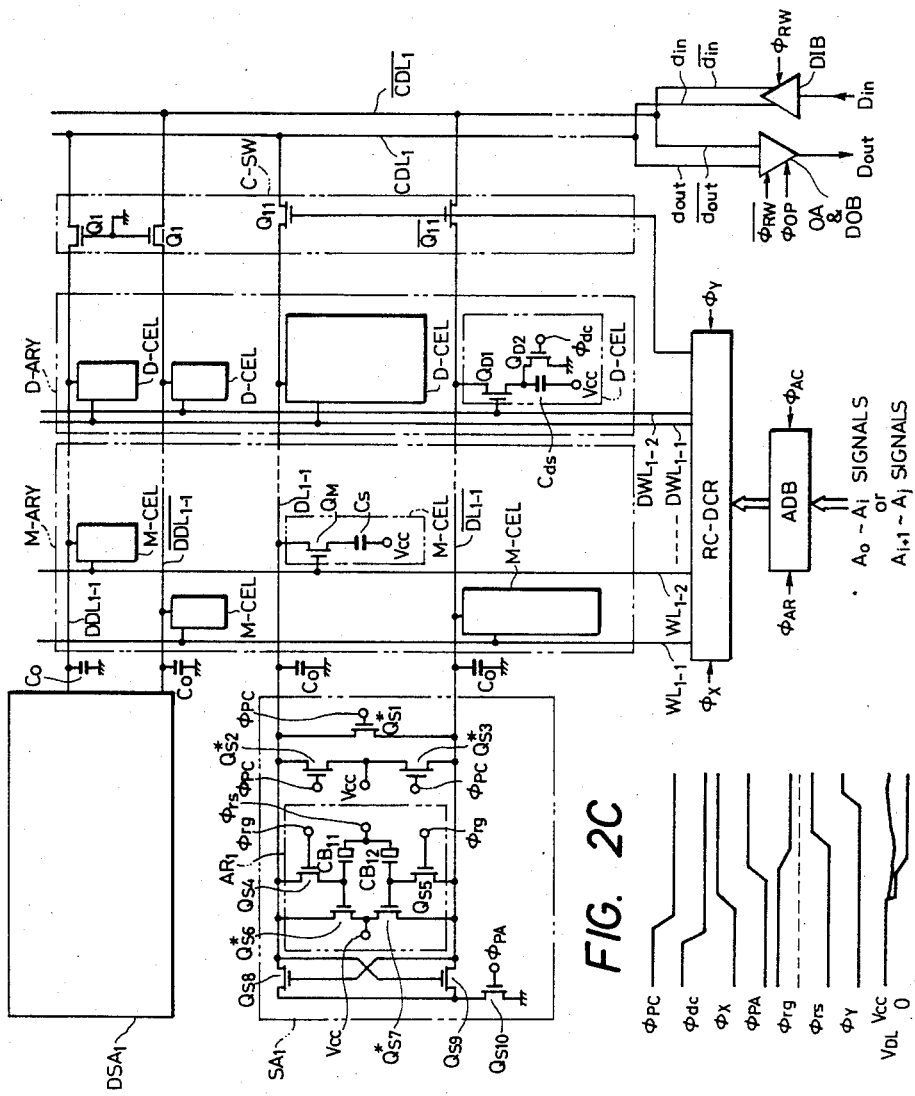
FIG. 2B is a circuit diagram of a practical example of the essential part of a D-RAM shown in FIG. 2A.
FIG. 2C is a timing chart of the operation of the essential part of a D-RAM shown in FIGS. 2A and 2B.

FIG. 2B is a circuit diagram of a practical example of the circuit constituting the essential part of the D-RAM shown in FIG. 2A. FIG. 2C is a timing chart of the operation thereof. The circuit diagram of the example will be described hereinunder in greater detail.

Constitution of Memory Cell M-CEL

Each of the 1-bit memory cells M-CEL comprises a capacitor $C_S$ for storing data and a MISFET $Q_M$ for the address selection. The data "1" or "0" is stored according to whether the capacitor $C_S$ has an electric charge or not.

Amount of Signal to Be Read Out

Data is read out by turning ON the MISFET $Q_M$ in order to connect the capacitor $C_S$ to the data line $DL_{1-1}$ and then sensing the change in the potential of the data line $DL_{1-1}$ which corresponds to the amount of electric charge stored in the capacitor $C_S$. In the description below, it is presumed for purposes of facilitating a qualitative understanding of the amount of the signal to be read out that each of the data lines has only the parasitic capacitance $C_O$. Supposing that the potential previously charged in the parasitic capacitance $C_O$ of the data line $DL_{1-1}$ is a supply voltage $V_{CC}$, when the data stored in the capacitor $C_S$ is "1" (the potential of the supply voltage $V_{CC}$), the potential $(V_{DL})$ "1" of the data line $DL_{1-1}$ is kept at the supply voltage $V_{CC}$ in addressing. On the other hand, when the data is "0" (0 V), the potential $(V_{DL})$ "0" becomes $\{C_O \cdot V_{CC} - C_S(V_W - V_{th})\}/C_O$, where $V_W$ is the gate voltage of the MISFET $Q_M$, and $V_{th}$ is the threshold voltage of the MISFET $Q_M$. Here, the difference between the logic "1" and the logic "0", i.e., the amount of the signal to be detected $\Delta V_S$ is as follows:

$$\Delta V_S = (V_{DL})\text{"1"} - (V_{DL})\text{"0"} = (V_W - V_{th}) \cdot C_S / C_O$$

If $V_W = V_{CC}$, the amount of the signal $\Delta V_S$ is as follows:

$$\Delta V_S = (V_{CC} - V_{th}) \cdot C_S / C_O$$

Since the memory cell is made very small and since a large number of memory cells is connected to each data line to form a memory matrix having a high degree of integration as well as a large capacitance, $C_S < < C_O$, the value $C_S/C_O$ becomes an extremely small value. Consequently, $\Delta V_S$ is an extremely minute signal.

Reference Signal in Reading

The dummy cells D-CEL are employed as references for detecting such minute signals. Each of the dummy cells D-CEL is manufactured under the same manufacturing conditions and with the same design constant as the memory cells M-CEL except for the fact that the capacitance value of its capacitor $C_{ds}$ is about half of that of the capacitor $C_S$. The capacitor $C_{ds}$ is charged at the ground potential by means of a MISFET $Q_{D2}$ prior to addressing (the other electrode being fixed at the supply voltage $V_{CC}$). Therefore, the signal change quantity $\Delta V_R$ applied to the data line $\overline{DL_{1-1}}$ by the dummy cell in addressing is represented by the following equation similarly to the signal change quantity $\Delta V_S$ to the data line $DL_{1-1}$ by the memory cell:

$$\Delta V_R = (V_{DW} - V_{th}') \cdot C_{ds} / C_O$$

where $V_{DW}$ is the gate voltage of the MISFET $Q_{D2}$, and $V_{th}'$ is the threshold voltage of the MISFET $Q_{D2}$.

If $V_{DW} = V_{CC}$, the $\Delta V_R$ is represented by the following equation:

$$\Delta V_R = (V_{CC} - V_{th}') \cdot C_{ds} / C_O$$

Since $C_{ds}$ is set to be almost half of $C_S$, the value $\Delta V_R$ is equal to almost half of $\Delta V_S$. Accordingly, it is possible to discriminate data "1" and "0" according to whether the signal change quantity $\Delta V_S$ of the data line $DL_{1-1}$ is smaller or larger than the signal change quantity $\Delta V_R$ of the data line $\overline{DL_{1-1}}$.

Arrangement of Circuits

The sense amplifier $SA_1$ is provided to enlarge the potential change difference produced in addressing into a sense period determined by a timing signal (sense amplifier control signal) $\phi_{PA}$ (the operation thereof is described later) and has input/output nodes connected with a pair of complementary data lines $DL_{1-1}$, $\overline{DL_{1-1}}$ disposed in parallel to each other. The number of memory cells connected to the data lines $DL_{1-1}$, $\overline{DL_{1-1}}$ respectively are made each other in order to increase the degree of detecting accuracy, and one dummy cell is connected to each of the data lines $DL_{1-1}$, $\overline{DL_{1-1}}$. Moreover, each memory cell M-CEL is connected between a word line and one of the pair of complementary data lines. Since each word line crosses both the lines constituting a data line pair, if the noise component generated in the word line is transmitted to a data line by means of electrostatic coupling, the noise components appear equally on both the data lines and are cancelled out by the differential type sense amplifier $SA_1$.

In particular, the dummy data lines are provided in the examples as described above. Therefore, the parasitic capacitance between data lines of each data line pair is allowed to be $2C_{dd}$ with respect to all the data lines. Consequently, it is possible to provide uniform coupling noise from a word line as well as uniform coupling noise resulting from the fluctuation in the substrate bias voltage $-V_{BB}$ with respect to all the data lines. Accordingly, each sense amplifier can reliably cancel out the coupling noises.

When the memory cell connected with one of the pair of complementary data lines $DL_{1-1}$, $\overline{DL_{1-1}}$ is selected, one of the pair of dummy word lines $DWL_{1-1}$, $\overline{DWL_{1-2}}$ is also selected so that a dummy cell is inevitably connected to the other data line.

Operation of Sense Amplifier

The sense amplifier $SA_1$ has a pair of MISFETs $Q_{S8}$, $Q_{S9}$ which are cross-linked and which differentially amplify a minute signal by performing positive feedback operation thereon. The positive feedback operation is started at the same time that the MISFET $Q_{S10}$ is made conductive in response to the timing signal (sense amplifier control signal) $\phi_{PA}$. The higher data-line potential ($V_H$) decreases at a low speed and the lower data-line potential ($V_L$) decreases at a high speed while enlarging the difference therebetween according to the potential difference applied in addressing. When the lower data-line potential $V_L$ reaches a threshold voltage $V_{th}$ of the cross-linked MISFETs, the positive feedback operation is completed, so that the higher data-line potential $V_H$ rests at a potential smaller than the supply voltage $V_{CC}$ but larger than the threshold voltage $V_{th}$ and the lower data-line potential $V_L$ finally reaches 0 V.

The stored data in a memory cell which is destroyed in addressing is restored (rewritten) by receiving the higher data-line potential $V_H$ or the lower data-line potential $V_L$ obtained by the sensing operation as it is.

Compensation for the Logic "1" Level

When the higher data-line potential $V_H$ lowers more than a given extent with respect to the supply voltage $V_{CC}$, however, a malfunction takes place that the state is read as the logic "0" while reading and rewriting are repeated a certain number of times. An active restoring circuit $AR_1$ is provided in order to prevent this type of malfunction. The active restoring circuit $AR_1$ has the function of selectively boosting only the higher data-line potential $V_H$ to the supply voltage potential $V_{CC}$ without exerting any effect on the lower data-line potential $V_L$. Each of MIS type variable capacitance elements $C_{B11}$ and $C_{B12}$ varies its electrostatic capacitance with the voltage applied to terminals on the left side as viewed in the figure. Logically, it is to be understood that a capacitor is formed at a voltage higher than the threshold voltage $V_{th}$ and no capacitor is formed at a voltage lower than that.

When MISFETs $Q_{S4}$, $Q_{S5}$ are made conductive in response to a timing signal (active restoring control signal) $\phi_{rg}$, the variable capacitance element $C_B$ belonging to the data line at the potential $V_H$ is charged. Next, when a timing signal (active restoring control signal) $\phi_{rs}$ becomes a high level, the gate potential of a MISFET $Q_{S6}$ or $Q_{S7}$ belonging to the data line becomes sufficiently higher than the supply voltage $V_{CC}$, so that the potential $V_H$ is restored to the supply voltage $V_{CC}$. In this case, the threshold voltage $V_{th}$ of the MISFETs $Q_{S6}$, $Q_{S7}$ are designed so as to be smaller than those of MISFETs without * in FIG. 2B in order to decrease the power loss in the MISFETs $Q_{S6}$, $Q_{S7}$.

I. READING OUT OPERATION

Precharging Period

When the timing signal $\phi_{PC}$ is at a high level (higher than the supply voltage $V_{CC}$), MISFETs $Q_{S2}$, $Q_{S3}$ are made conductive, and the floating capacitance $C_O$ of each of the pair of complementary data lines $DL_{1-1}$, $\overline{DL_{1-1}}$ is precharged to the supply voltage $V_{CC}$. Since a MISFET $Q_{S1}$ is made conductive simultaneously therewith, if there is any unbalance between the precharging operations by the MISFETs $Q_{S2}$ and $Q_{S3}$, respectively, the pair of complementary data lines $DL_{1-1}$, $\overline{DL_{1-1}}$ are short-circuited with each other so as to be set under the same potential condition. The threshold voltage $V_{th}$ of each of the MISFETs $Q_{S1}$ through $Q_{S3}$ is set to be lower than that of the MISFETs without * in FIG. 2B in order to prevent the production of the voltage loss between the source and drain thereof.

At the time, the MISFET $Q_{d2}$ is made conductive in response to a timing signal (discharge control signal) $\phi_{dc}$, and the dummy cell D-CEL is also reset in a given state.

Row Addressing Period

Row addressing signals $A_O$ through $A_i$ supplied from an address buffer ADB at a timing of a timing signal (address buffer control signal) $\phi_{AR}$ are decoded by a row-column decoder RC-DCR, and addressing of a memory cell M-CEL and a dummy cell D-CEL is started simultaneously with the rise of a word line control signal $\phi_X$.

As a result, a voltage difference of almost $\Delta V_S/2$ is produced between the pair of complementary data lines $DL_{1-1}$, $\overline{DL_{1-1}}$ according to the stored content of the memory cell as described above.

Sensing

At the same time that the MISFET $Q_{S10}$ starts conducting in response to the timing signal (sense amplifier control signal) $\phi_{PA}$, the sense amplifier $SA_1$ starts the positive feedback operation and amplifies the detection signal of $\Delta V_S/2$ generating in addressing. After the amplifying operation is almost completed, the above-described active restoring circuit $AR_1$ restores the level of the logic "1" to the supply voltage $V_{CC}$ in synchronism with the timing signal (active restoring control signal) $\phi_{rs}$.

Data Output Operation

Column address signals $A_{i+1}$ through $A_j$ sent from the address buffer ADB in synchronism with a timing signal (address buffer control signal) $\phi_{AC}$ are decoded by the row-column decoder RC-DCR, and then the data stored in the memory cell M-CEL at the column address selected by a timing signal (column switch control signal) $\phi_Y$ is transmitted to common data lines $CDL_1$, $\overline{CDL_1}$ through a column switch C-SW.

Next, a main amplifier data output buffer OA&DOB is actuated in response to a timing signal (data output buffer and main amplifier control signal) $\phi_{OP}$, so that the read stored data is sent out to an output terminal $D_{out}$ of the chip. The main amplifier data output buffer OA&DOB is made inoperative in response to a timing (data signal output buffer control signal) $\phi_{RW}$ in writing.

II. WRITING OPERATION

Row Addressing Period

Precharging, addresssing and sensing operations are quite the same as the above-described reading out operation. Consequently, the stored data in the memory cell to be essentially written is read out to the pair of complementary data lines $DL_{1-1}$, $\overline{DL_{1-1}}$ regardless of the logical value of an input write data $D_{in}$. Since the read out data is to be neglected by the writing operation described later, it may be considered that the operation so far is essentially the selection of a row address.

Writing Period

The pair of data lines $DL_{1-1}$, $\overline{DL_{1-1}}$, located on the column selected in synchronism with the timing signal (column switch control signal) $\phi_Y$ similarly to the reading operation are connected to the common data lines $CDL_1$, $\overline{CDL_1}$ respectively through the column switch C-SW.

Next, complementary writing input signals $d_{in}$, $\overline{d_{in}}$ supplied from the data input buffer DIB in synchronism with the timing signal (data input buffer control signal) $\phi_{RW}$ are written in the memory cell M-CEL through the column switch C-SW. Although the sense amplifier $SA_1$ is also operative at this time, the data appering on the pair of column data lines $DL_{1-1}$, $\overline{DL_{1-1}}$ is determined according to the data of the input signal $D_{in}$ because the output impedance of the data input buffer DIB is low.

III. REFRESHING OPERATION

Refreshing is effected in such a way that data which is stored in the memory cell M-CEL and which is lost is read out to a column common data line DL, and the read-out data is restored to a given level by means of the sense amplifier $SA_1$ as well as the active restoring circuit $AR_1$ and rewritten in the memory cell M-CEL. Accordingly, the refreshing operation is the same as the row addressing and sensing period operations described in connection with the reading out operation. In this case, however, the column switch C-SW is made inoperative, and refreshing is effected for all the columns simultaneously as well as row by row in order.

FIG. 2 is a block diagram of another example of the circuit constituting the essential part of the present invention.

Figure 2D:
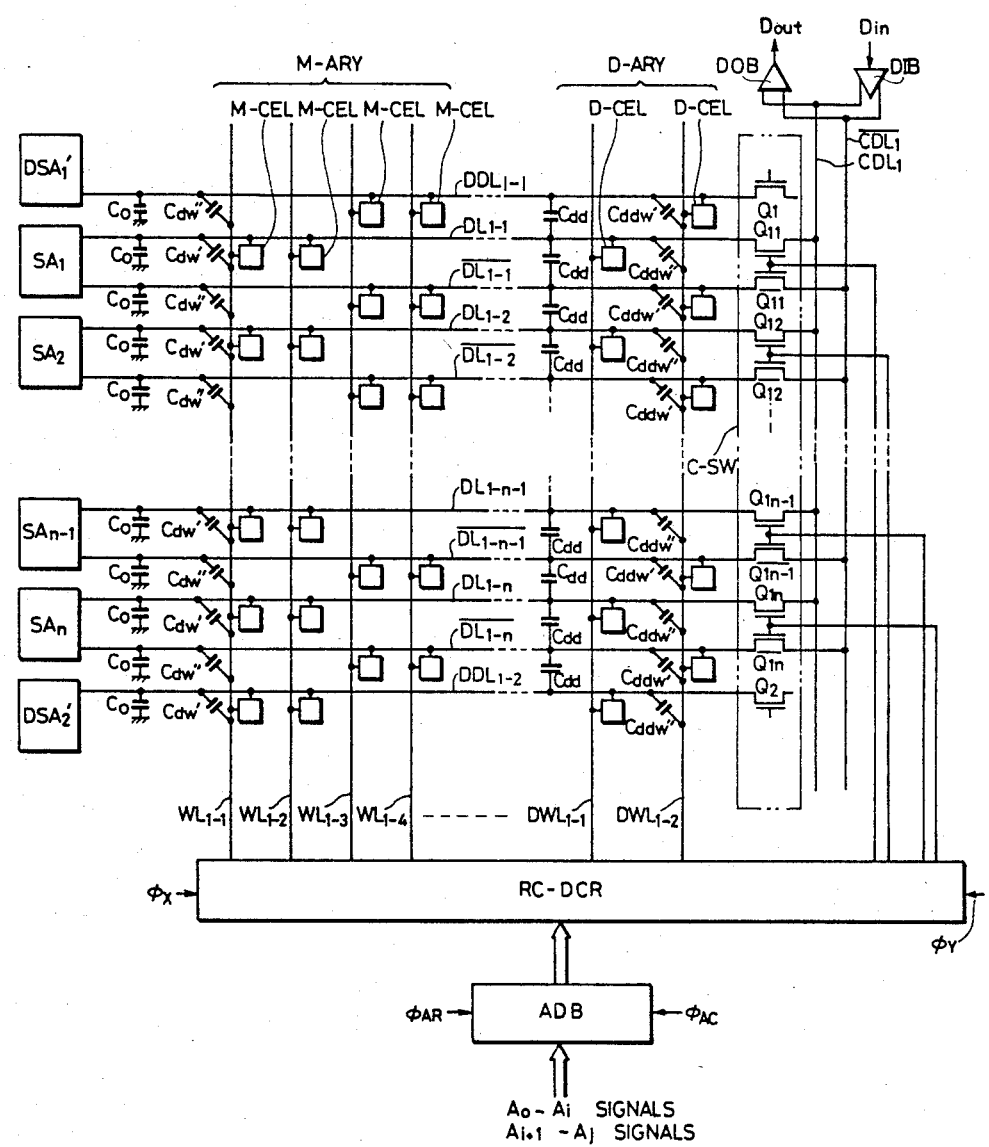
FIG. 2D is a block diagram of another embodiment of the circuit constituting an essential part of a D-RAM according to the present invention.

Unlike the example shown in FIG. 2A, in the example of FIG. 2D, each of the dummy data lines provided outside the outermost data lines $DL_{1-1}$, $\overline{DL_{1-n}}$ in the memory array part M-ARY (or the dummy array part D-ARY) comprises a single dummy data line ($DDL_{1-1}$, $DDL_{1-2}$). These dummy data lines $DDL_{1-1}$, $DDL_{1-2}$ allow the composite capacitances between data lines of all the data lines $DL_{1-1}$, $DL_{1-2}$, ..., $DL_{1-n}$ to be substantially equal to each other. In addition, similarly to the dummy data lines $\overline{DDL_{1-1}}$ and $DDL_{1-2}$ shown in FIG. 2A, each of the above-mentioned dummy data lines $DDL_{1-1}$, $DDL_{1-2}$ is connected with a plurality of memory cells M-CEL, a single dummy cell D-CEL and the corresponding one of MOS transistors $Q_1$, $Q_2$ for forming a column switch as shown in the figure. Moreover, the dummy data lines $DDL_{1-1}$, $DDL_{1-2}$ are connected with dummy sense amplifiers $DSA'_1$, $DSA'_2$ each comprising a part of the circuit elements constituting a sense amplifier, as shown in the figure. Thus, the parasitic capacitance $C_O$ of each of the dummy data lines $DDL_{1-1}$, $DDL_{1-2}$ is made equal to that of each of the data lines $DL_{1-1}$, $DL_{1-2}$, ..., $DL_{1-n}$.

The dummy data lines $DDL_{1-1}$, $DDL_{1-2}$ are provided in order to allow the parasitic capacitance between data lines of each of the outermost data lines $DL_{1-1}$, $\overline{DL_{1-n}}$ to be equal to that of the other data lines, i.e., $2C_{dd}$. Therefore, it is unnecessary to read out signals from the dummy data lines $DDL_{1-1}$, $DDL_{1-2}$. Consequently, the dummy data lines are not connected to the common data lines $CDL_1$, $\overline{CDL_1}$.

Figure 2E:
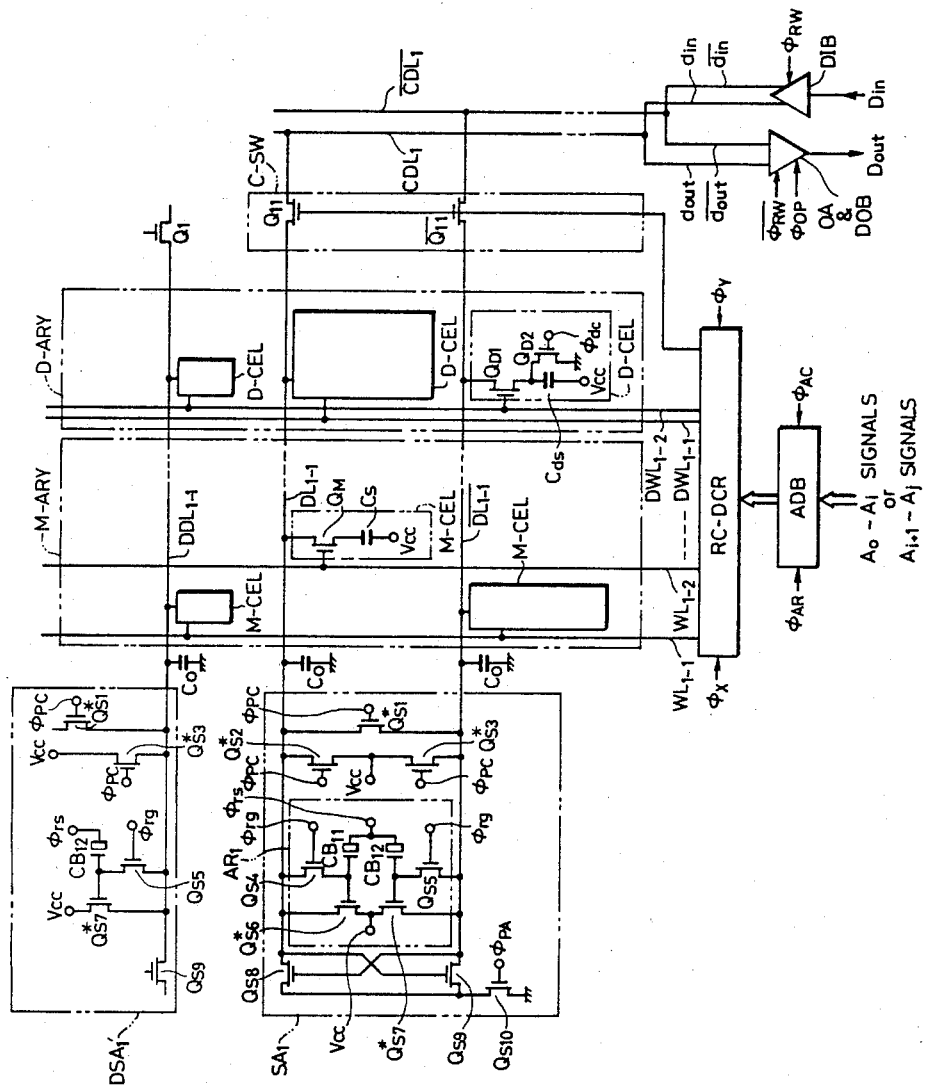
FIG. 2E is a circuit diagram of a practical example of the essential part of a D-RAM shown in FIG. 2D.

FIG. 2E is a circuit diagram of the practical example of the circuit constituting the essential part of the D-RAM shown in FIG. 2D. Shown in this example is a practical circuit of the dummy sense amplifier $DSA'_1$ connected to the dummy data line $DDL_{1-1}$.

As can be seen, the dummy sense amplifier $DSA'_1$ is composed of circuit elements connected with a data line in the circuit elements to form a differential type sense amplifier $SA_1$. Consequently, the dummy sense amplifier $DSA'_1$ is composed of about half of the circuit elements constituting the differential sense amplifier $SA'_1$.

Since the operation of the circuit of this example is the same as described with reference to FIG. 2B and FIG. 2C, the description thereof is omitted.

Figure 3A:
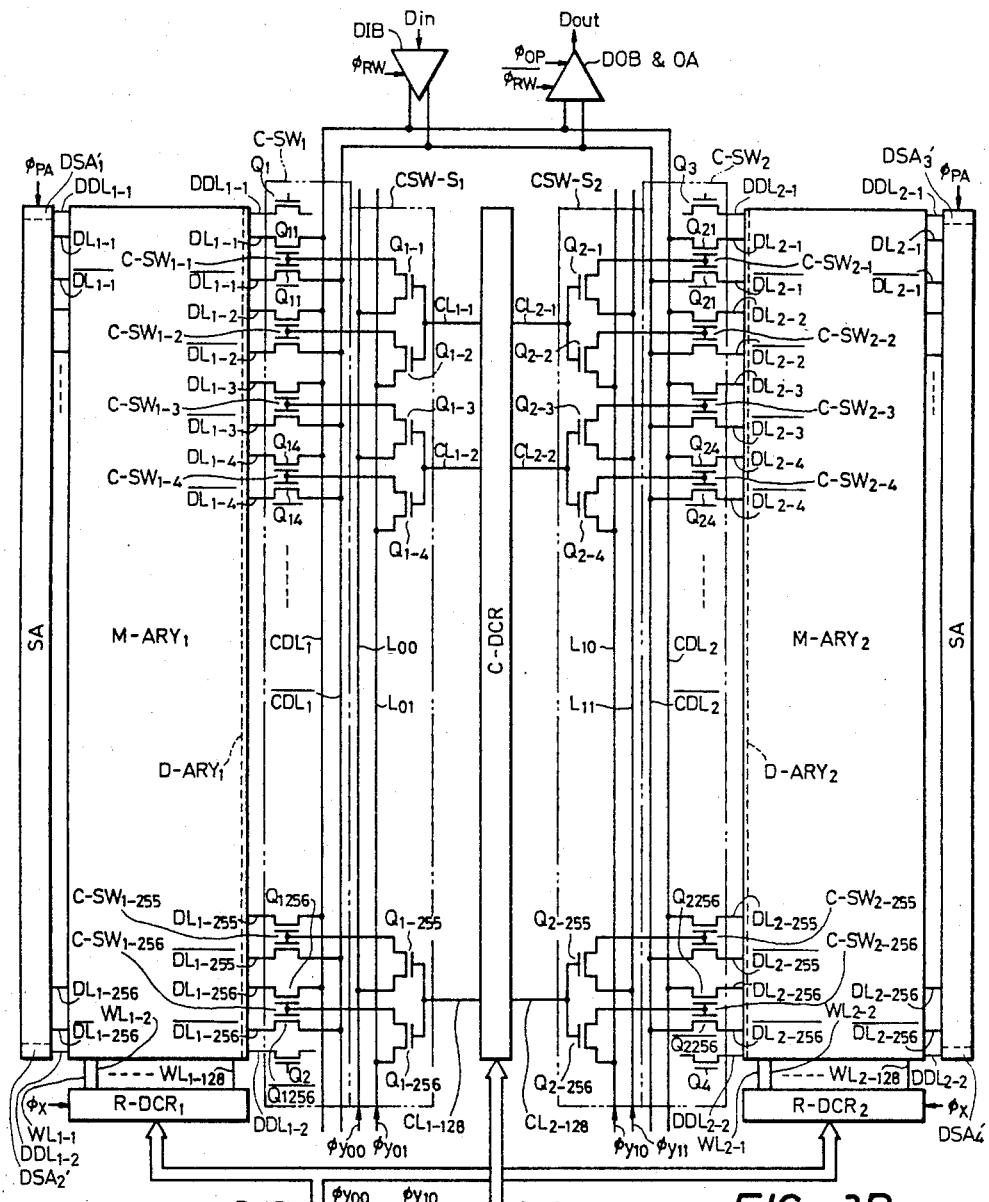
FIG. 3A is a circuit diagram of a preferred third embodiment of the present invention utilizing plural memory mats.

FIG. 3A is a circuit diagram of a D-RAM having about 64Kbit-memory cells arranged separately in two memory cell matrixes (memory arrays M-ARY$_1$, M-ARY$_2$) each having a memory capacity of 128 rows$\times$256 columns=32,768 bits (32Kbits). Principal blocks in the figure are drawn in accordance with the actual geometric arrangement.

Decoding output signals of $2^7=128$ kinds obtained according to row addressing signals $A_0\sim A_6$ are applied to address selecting lines (word lines WL) in the row system of each of the memory arrays M-ARY$_1$, M-ARY$_2$ from row decoders (serving also as word drivers) R-DCR$_1$, R-DCR$_2$, respectively.

A column decoder C-DCR provides decoding output signals of 128 kinds according to column address signals $A_9\sim A_{15}$. The column selecting decoding output signals are common to the right and left memory arrays as well as the upper and lower adjacent columns in each of the memory arrays, i.e., four columns in total.

The address signals $A_7$ and $A_8$ are allotted in order to select one of these four columns. For instance, the address signal $A_7$ is allotted for selecting one of the right and left columns, while the address signal $A_8$ is allotted for selecting one of the upper and lower columns.

A $\phi_{yij}$ signal generating circuit $\phi_{yij}$-SG decodes data into four kinds of combination according to the address signals $A_7$, $A_8$. Column switch selectors CSW-S$_1$, CSW-S$_2$ change over the columns according to output signals $\phi_{y00}$, $\phi_{y01}$, $\phi_{y10}$, $\phi_{y11}$ of the $\phi_{yij}$ signal generating circuit $\phi_{yij}$-SG.

Thus, the decoder for selecting the columns of the memory arrays is divided into two stages: the column decoder C-DCR and the column switch selectors CSW-S$_1$, CSW-S$_2$. The division of the decoder into two stages aims first at the prevention of the production of any wasteful space in the IC chip. In other words, it aims at coincidence between the longitudinal arrangement pitch of NOR gates having a relatively large area for carrying a pair of right and left output signal lines of the column decoder C-DCR and the memory cell column arrangement pitch. Namely, the division of the decoder into two stages allows reduction in the number of transistors needed for constituting the NOR gates, so that the area occupied thereby can be made smaller.

The second aim in dividing the decoder into two stages is to decrease the load on each address signal line and improve the switching speed by reducing the number of the NOR gates connected to one address signal line.

The address buffer ADB processes the multiplexed eight external address signals $A_0\sim A_7$; $A_8\sim A_{15}$ into eight kinds of pairs of complementary address signals ($a_0$, $\overline{a_0}$)~($a_7$, $\overline{a_7}$); ($a_8$, $\overline{a_8}$)~($a_{15}$, $\overline{a_{15}}$) respectively and transmits them to the decoder circuit at the timings $\phi_{AR}$, $\phi_{AC}$ synchronized with the operation inside the IC chip.

In the preferred embodiment, dummy data lines DDL$_{1-1}$, DDL$_{1-2}$, DDL$_{2-1}$, DDL$_{2-2}$ are provided at the outermost parts of the memory arrays M-ARY$_1$ and M-ARY$_2$, i.e., the uppermost parts and the lowermost parts thereof, respectively. In addition, MOS transistors Q$_1$, Q$_2$, Q$_3$, Q$_4$ for forming column switches and dummy sense amplifiers DSA$'_1$, DSA$'_2$, DSA$'_3$, DSA$'_4$ are provided so as to correspond thereto respectively.

Figure 3B:
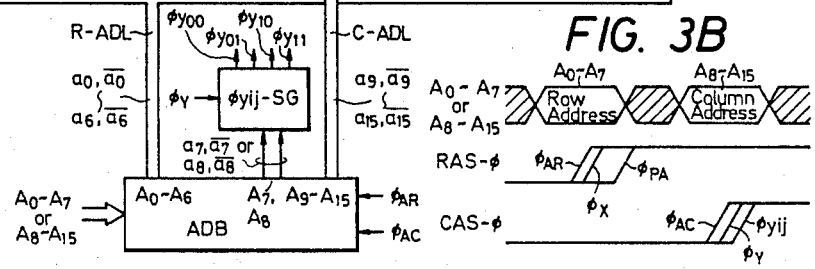
FIG. 3B is a timing chart of the operation of the preferred embodiment of FIG. 3A.

The circuit operation in the address setting process in the 2-mat system 64K-D-RAM will be described hereinunder with reference to FIG. 3A and FIG. 3B.

First, when the address buffer control signal $\phi_{AR}$ of the row system rises to a high level, 7 kinds of pairs of complementary two address signals ($a_0$, $\overline{a_0}$)~($a_6$, $\overline{a_6}$) corresponding to the row address signals A$_0$~A$_6$ are applied to the row decoders R-DCR$_1$, R-DCR$_2$ from the address buffer ADB through a row address line R-ADL.

Next, when the word line control signal $\phi_X$ rises to a high level, the row decoders R-DCR$_1$, R-DCR$_2$ are made active, and one of the word lines in each of the memory arrays M-ARY$_1$, M-ARY$_2$ is selected and made to be a high level.

Next, when the address buffer control signal $\phi_{AC}$ of the column system rises to a high level, 7 kinds of pairs of complementary column address signals ($a_9$, $\overline{a_9}$)~($a_{15}$, $\overline{a_{15}}$) corresponding to the column address signals A$_9$~A$_{15}$ are applied to the column decoder C-DCR from the address buffer ADB through the column address line C-ADL.

As a result, one of 128 pairs of output signal lines of the column decoder C-DCR is made to be a high level, and the high-level signal is applied to the column switch selectors CSW-S$_1$, CSW-S$_2$.

Next, when the column switch control signal $\phi_Y$ rises to a high level, the $\phi_{yij}$ signal generating circuit $\phi_{yij}$-SG is made operative.

On the other hand, the pair of complementary signals ($a_7$, $\overline{a_7}$) corresponding to the address signal A$_7$ is previously applied to the $\phi_{yij}$ signal generating circuit $\phi_{yij}$-SG when the address buffer control signal $\phi_{AR}$ becomes a high level, while the pair of complementary signals ($a_8$, $\overline{a_8}$) corresponding to the address signal A$_8$ is previously applied to the $\phi_{yij}$ signal generating circuit $\phi_{yij}$-SG when the address buffer control signal $\phi_{AC}$ becomes a high level. Consequently, when the column switch control signal $\phi_Y$ becomes a high level, almost simultaneously therewith, the $\phi_{yij}$ signal generating circuit $\phi_{yij}$-SG transmits a signal to each of the column switch selectors CSW-S$_1$, CSW-S$_2$.

Thus, one pair is selected from a total of 512 pairs of transistors in the column switches C-SW$_1$, C-SW$_2$, and one pair of data lines DL in the memory array is connected to the common data line CDL.

Figure 4A:
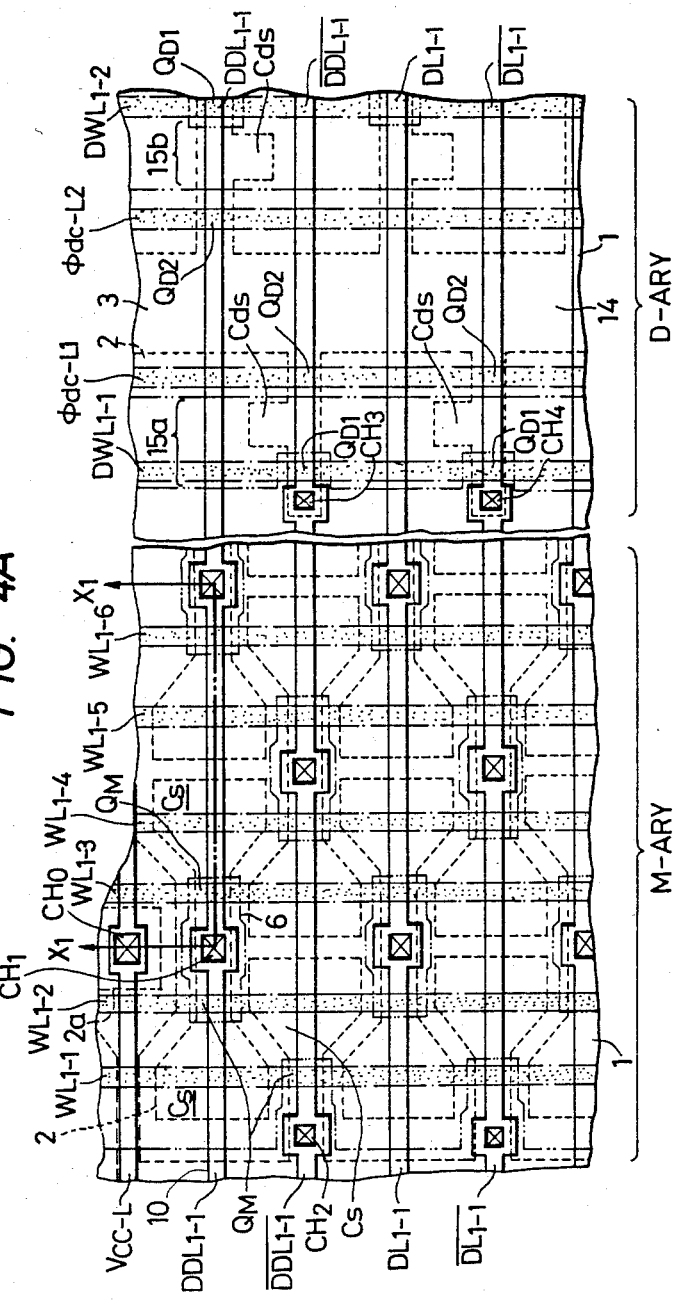
FIG. 4A shows a layout pattern of an example of a memory array M-ARY and a dummy array D-ARY which can be used in the embodiments of the present invention.

FIG. 4A shows a layout pattern of the memory array M-ARY and the dummy array D-ARY shown in the example of FIG. 2A and FIG. 2B.

The memory array M-ARY shown in FIG. 4A has a plurality of memory cells M-CEL arranged on a semiconductor substrate 1, while the dummy array D-ARY shown in FIG. 4A has a plurality of dummy cells D-CEL arranged on the semiconductor substrate 1.

First, the memory array M-ARY shown in FIG. 4A is arranged as follows.

Figure 5:
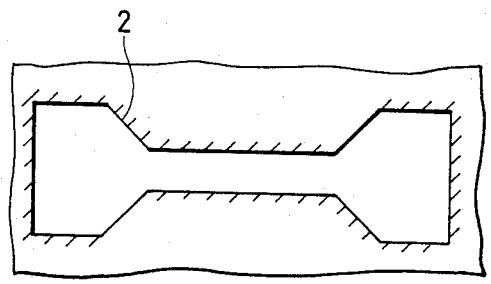
FIG. 5 shows a basic pattern of a field insulating film 2 in accordance with the present invention.

A field insulating film 2 having a basic pattern shown in FIG. 5 is formed on the surface of the semiconductor substrate 1 in order to separate the memory cells M-CEL from each other. Each memory cell comprises a MISFET Q$_M$ and a capacitor C$_S$ for storage.

Unlike the field insulating film 2 which follows the basic pattern rule, a field insulating film 2$a$ is exceptionally disposed underneath a contact hole CH$_0$ for applying the supply voltage V$_{CC}$ to a first polycrystalline silicon layer 6. Accordingly, it is possible to prevent the occurrence of an accident that the aluminum-silicon alloy formed according to the interaction between an aluminum layer and the polycrystalline silicon layer near the contact hole CH$_0$ penetrates through the insulating film underneath the contact hole CH$_0$ to undesirably reach the surface of the semiconductor substrate 1.

Figure 6:
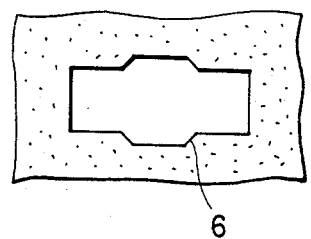
FIG. 6 shows a basic pattern of a polycrystalline silicon layer 6 in accordance with the present invention.

The first polycrystalline silicon layer 6 employed as one of electrodes of the storage capacitor C$_S$ in each memory cell M-CEL is formed having a basic pattern shown in FIG. 6 on the field insulating film 2 and a gate insulating film 3. Moreover, the word lines WL$_{1-1}$~WL$_{1-6}$ formed from a second polycrystalline silicon layer 8 extend over the first polycrystalline silicon layer 6 in the vertical direction as viewed in FIG. 4A. In addition, a power supply line V$_{CC-L}$ for supplying the supply voltage V$_{CC}$ to the polycrystalline silicon layer 6 as one electrode of the storage capacitor C$_S$ extends in the horizontal direction as viewed in FIG. 4A.

On the other hand, the dummy data lines DDL$_{1-1}$, $\overline{DDL_{1-1}}$ and the data lines DL$_{1-1}$, $\overline{DL_{1-1}}$ formed from the aluminum layer 10 extend substantially in parallel with the power supply line V$_{CC-L}$ as shown in FIG. 4A. The dummy data line DDL$_{1-1}$ is connected to the drain region of the MISFET Q$_M$ in the memory cell M-CEL through a contact hole CH$_1$, while the dummy data line $\overline{DDL_{1-1}}$ is connected to the drain region of the MISFET Q$_M$ in another memory cell M-CEL through a contact hole CH$_2$. Morover, each of the data lines DL$_{1-1}$, $\overline{DL_{1-1}}$ extends in the horizontal direction as viewed in FIG. 4A similarly to the dummy data lines DDL$_{1-1}$, $\overline{DDL_{1-1}}$ and is connected to the drain region of the MISFET Q$_M$ in a memory cell through a contact hole at a given portion.

Next, the dummy cell D-CEL shown in FIG. 4A is arranged as follows.

The field insulating film 2 is formed on one part of the surface of the semiconductor substrate 1, while the gate insulating film 3 is formed on the other part of the surface of the semiconductor substrate 1. On the field insulating film 2 and the gate insulating film 3, first polycrystalline silicon layers 15$a$, 15$b$ extend separately from each other in the vertical direction as viewed in FIG. 4A. The width of each of the first polycrystalline silicon layers 15$a$, 15$b$ is extremely important for determining the capacitance value of the capacitor C$_{ds}$ in each dummy cell D-CEL. An N$^+$ type semiconductor region 14 is located between the first polycrystalline silicon layers 15$a$ and 15$b$ and employed as a ground line common to the dummy cells D-CEL.

Moreover, the dummy word line DWL$_{1-1}$ formed from a second polycrystalline silicon layer extends over the first polycrystalline silicon layer 15$a$. The dummy word line DWL$_{1-1}$ constitutes the gate electrode of a MISFET Q$_{D1}$ of each dummy cell D-CEL. On the other hand, a control signal line $\phi_{dc-L1}$ formed from the second polycrystalline silicon layer for applying the discharging control signal $\phi_{dc}$ shown in FIG. 2B is separated from the dummy word line DWL$_{1-1}$ while extending in parallel therewith. The control signal line $\phi_{dc-L1}$ constitutes the gate electrode of a MISFET $Q_{D2}$ in each dummy cell D-CEL.

Similarly, a dummy word line $DWL_{1-2}$ and a control signal line $\phi_{dc-L2}$ extend in parallel with the dummy word line $DWL_{1-1}$ and the control signal line $\phi_{dc-L1}$. Moreover, dummy data lines $DDL_{1-1}$, $\overline{DDL}_{1-1}$ extend from the memory array M-ARY as shown in FIG. 4A. The dummy data line $\overline{DDL}_{1-1}$ is connected to the drain region of the MISFET $Q_{D1}$ of a dummy cell D-CEL through a contact hole $CH_3$ and, similarly, the data line $DL_{1-1}$ is connected to the drain region of the MISFET $Q_{D1}$ in another dummy cell D-CEL through a contact hole $CH_4$.

Figure 7:
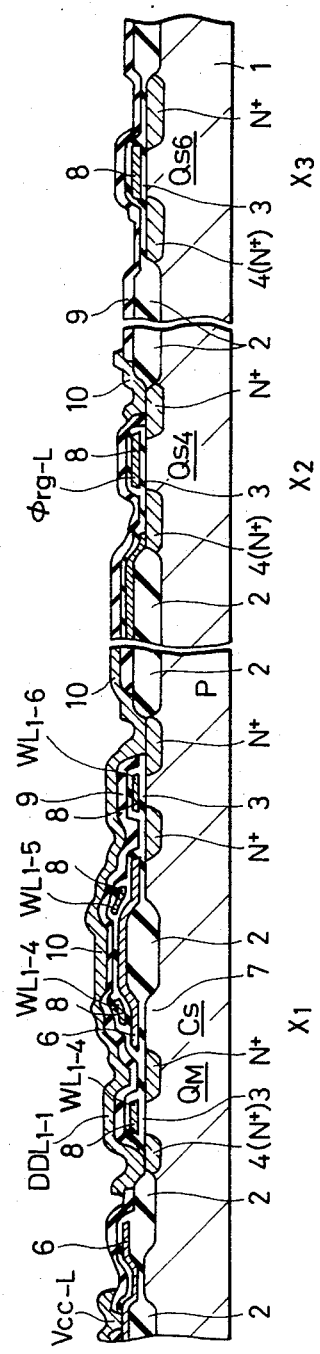
FIG. 7 shows sectional views of the IC structure taken along lines $X_1-X_1$, $X_2-X_2$ and $X_3-X_3$ of the layout patterns shown in FIGS. 4A, 4B and 4C, respectively.

FIG. 7 shows a sectional view of the IC structure taken along a line $X_1$—$X_1$ of the above-described layout pattern of FIG. 4A.

Figure 4B:
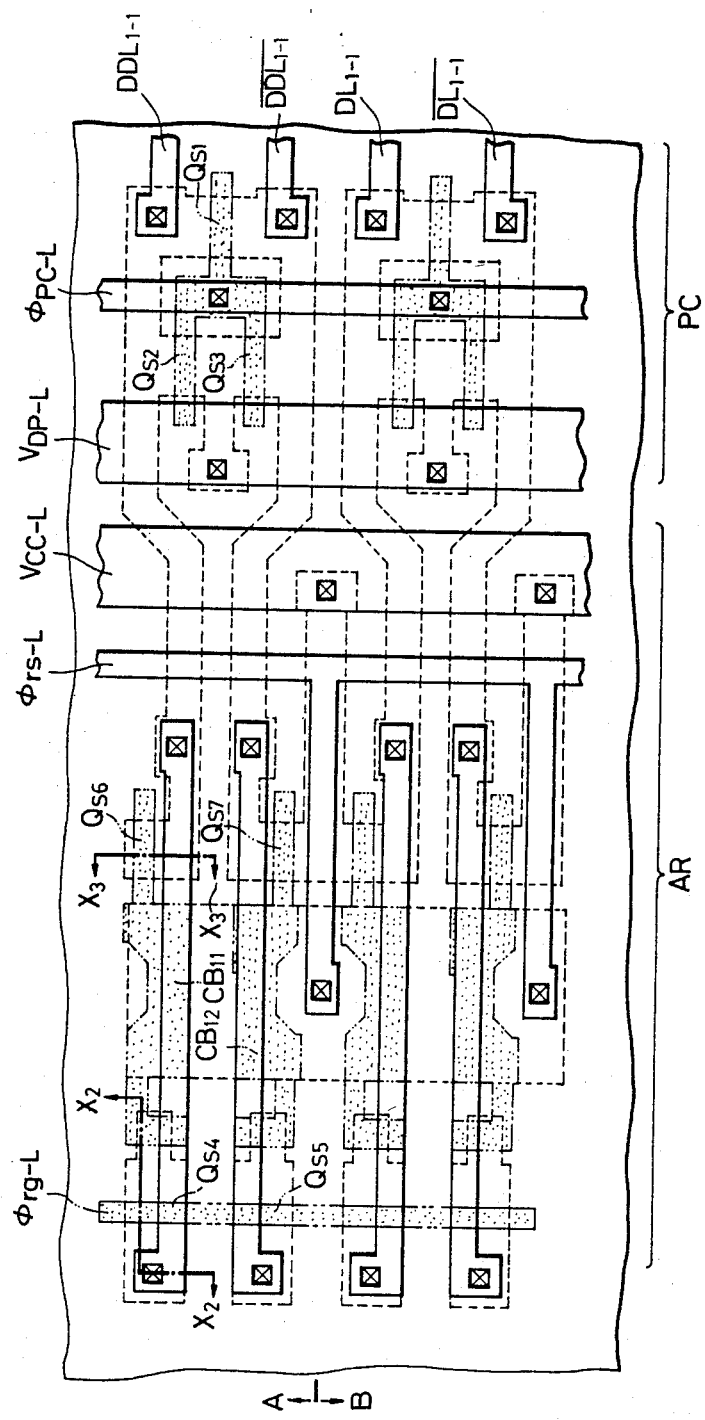
FIG. 4B shows a layout pattern of an example of a part of a sense amplifier such as that shown in FIG. 2B in accordance with the present invention.

FIG. 4B shows a layout pattern of a part of a peripheral circuit, e.g., the sense amplifier $SA_1$ and the dummy sense amplifier $DSA_1$ shown in FIG. 2B.

In FIG. 4B, a reference symbol AR designates an active restoring section, while a reference symbol PC denotes a data line precharging circuit section.

The active restoring section AR has two active restoring circuits $AR_1$ as shown in FIG. 2B. In other words, one active restoring circuit is formed on the side of an arrow A shown in FIG. 4B, and the active restoring circuit is formed on the side of an arrow B. In the active restoring section AR, active restoring control signal lines $\phi_{rg-L}$, $\phi_{rs-L}$ and a power supply line $V_{CC-L}$ common to both the active restoring circuits are arranged as shown in FIG. 4B.

On the other hand, the precharging circuit section PC has two data line precharging circuits arranged corresponding to the two active restoring circuits. In the precharging circuit section PC, a potential line $V_{DP-L}$, a precharging control signal line $\phi_{PC-L}$ and dummy data lines $DDL_{1-1}$, $\overline{DDL}_{1-1}$ as well as data lines $DL_{1-1}$, $\overline{DL}_{1-1}$ extending to the memory array M-ARY shown in FIG. 4A are arranged as shown in FIG. 4B. Also, the MISFETs $Q_{S1}$~$Q_{S7}$ and the capacitors $C_{B11}$, $C_{B12}$ in FIG. 2B are also arranged as shown in FIG. 4B.

FIG. 7 also shows sectional views of the IC structure taken along lines $X_2$—$X_2$, $X_3$—$X_3$ respectively shown in the layout pattern of FIG. 4B.

Figure 4C:
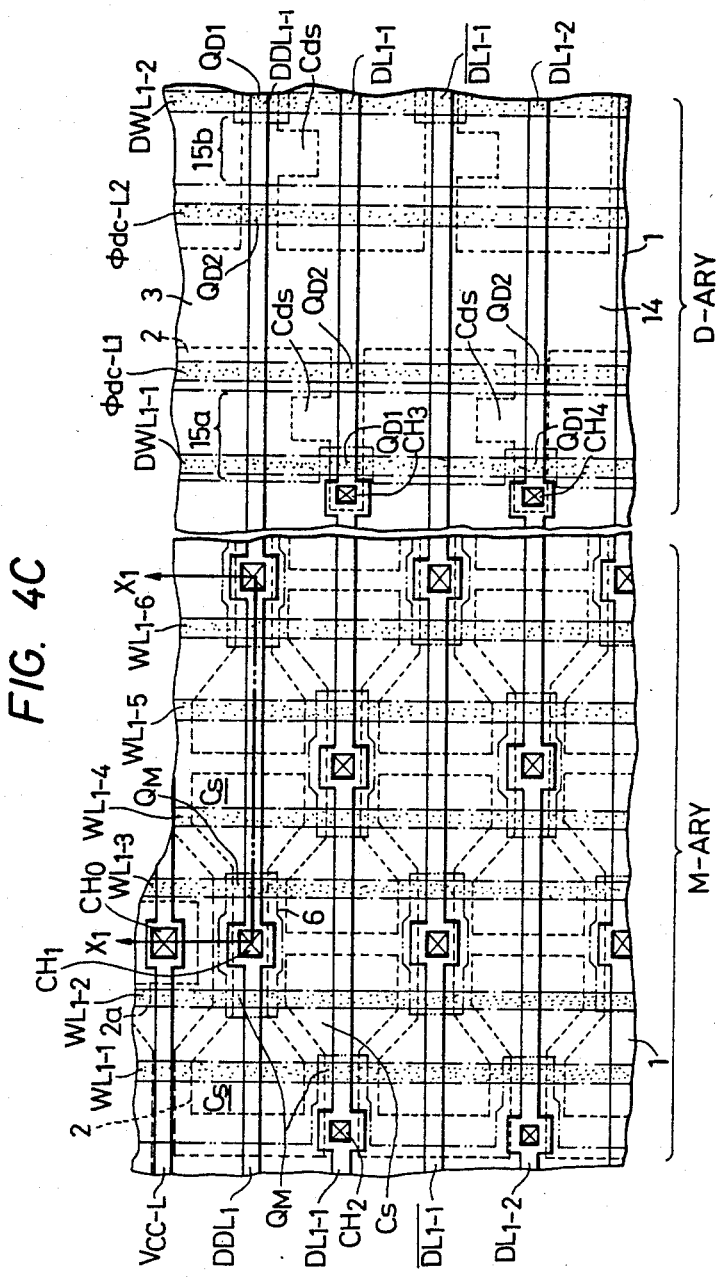
FIG. 4C shows a layout pattern of another example of the memory array and the dummy array.

FIG. 4C shows a layout pattern of the memory array M-ARY and the dummy array D-ARY according to the example shown in FIG. 2D and FIG. 2E.

The basic layout in this example is the same as shown in FIG. 4A. In the example shown in FIG. 2D and FIG. 2E, however, the data line $DL_{1-1}$ is arranged in the second line since the dummy data line $DDL_{1-1}$ is constituted by a single dummy data line.

FIG. 4D shows a layout pattern of a part of a peripheral circuit, e.g., the dummy sense amplifier $DSA'_1$ and the sense amplifier $SA_1$ shown in FIG. 2E.

In this example, since the dummy data line is constituted by a single line similarly to the dummy data line $DDL_{1-1}$, the active restoring section AR and the precharging circuit section PC of the dummy sense amplifier $DSA'_1$ are reduced. Thus, the area occupied by these circuits is smaller than that of the layout shown in FIG. 4B or the sense amplifier $SA_1$ shown in the same figure. Other than this, the layout is basically similar to the layout shown in FIG. 4B.

According to the preferred embodiment described above, the composite parasitic capacitances between data lines of all the data lines can be made equal to each other, i.e., $2C_{dd}$, because the dummy data lines are provided outside the outermost data lines $DL_{1-1}$, $\overline{DL}_{1-n}$ respectively. Accordingly, the coupling noises from a word line and a dummy word line and the coupling noises resulting from the fluctuation in the substrate bias voltage $-V_{BB}$ are equally generated in the lines constituting a data line pair ($DL_{1-1}$, $\overline{DL}_{1-1}$), so that they can be cancelled out by means of a differential type sense amplifier ($SA_1$). Thus, since the minute voltage difference fed to the sense amplifier ($SA_1$) is not affected by the coupling noises, it is possible to prevent malfunction of the sense amplifier ($SA_1$) and to enlarge the input level margin.

Moreover, in a case of enlarging the memory capacity to, e.g., 1M bits, the application of the present invention prevents appearance of the above-described adverse effects even if the distance between adjacent data lines is made as small as possible and the capacitance value of the parasitic capacitance $C_{dd}$ between data lines is enlarged. Accordingly, the technical idea of the present invention is extremely helpful in forming a memory array of high density, i.e., for enlarging the memory capacity.

The present invention is not limited to the above-described preferred embodiment, and other arrangements incorporating the features of the present invention are possible. For example, the arrangement of the memory array may be modified to take a variety of forms other than the above-described 2-mat system. To this end, an 8-mat system could be used wherein a memory cell of about 64K bits is divided into 8 memory arrays $M-ARY_{1\sim 8}$ each having a memory capacity of 128 rows × 54 columns = 8192 bits (8K bits).

Moreover, the parasitic capacitance $C_O$ of the dummy data line may be replaced by capacitance means equivalent to the above-described memory cells, dummy cell and dummy sense amplifier.

The invention can be applied to a dynamic RAM having redundancy memory cells. The redundancy memory cells are connected to, e.g., each line of an additional data line pair. The data line pair is further connected with dummy cells and a sense amplifier. Consequently, the redundancy memory cells, the additional data line pair, the dummy cells and the sense amplifier are arranged similarly to, e.g., the data line pair $DL_{1-1}$, $\overline{DL}_{1-1}$ shown in FIG. 2A and the memory cells, the dummy cells and the sense amplifier $SA_1$ which are connected therewith. The additional data line pair and the like are disposed at an end part of a memory array, for example. The additional data line pair is connected to common data lines ($CDL_1$, $\overline{CDCL}_1$) through redundancy column switch MISFETs arranged similarly to the column switch MISFETs $Q_{11}$, $\overline{Q}_{11}$ shown in FIG. 2A. A redundancy address decoder is provided for the switching control of the redundancy column switch MISFETs. Accordingly, if there is a data line pair connected with a defective memory cell, or if there is a defective data line pair, the data line pair is replaced with the additional data line pair. In other words, when an address signal represents the defective data line pair, the additional data line pair is accessed.

When the additional data line pair is disposed at an end part of the memory array, there is the possibility that unbalanced coupling noises are applied to the lines constituting the additional data line pair, respectively. Dummy data lines and dummy sense amplifiers arranged similarly to the above-described examples can be disposed in order to balance the coupling noises with each other.

Moreover, when providing a plurality of additional data line pairs, i.e., a plurality of data line pairs for redressing defects, it is possible to take such an arrangement that one of the additional data line pairs other than the additional data line pairs disposed at the outermost ends of the memory array respectively is preferentially selected to replace a defective data line pair. In this case, each of the data line pairs disposed at the outermost ends of the memory array respectively has a function similar to that of the dummy data lines in the above-described examples if it does not replace the defective data line pair by the address changing operation for redressing defects.

It is to be understood that the above-described arrangements are simply illustrative of the application of the principles of this invention. Numerous other arrangments may be readily devised by those skilled in the art which embody the principles of the invention and fall within its spirit and scope.

I claim:

1. A dynamic RAM integrated circuit device having a folded bit line arrangement comprising:
a memory array having a predetermined plurality of data line pairs formed on a semiconductor substrate, a plurality of memory cells each connected with a corresponding one of said plurality of data line pairs and a plurality of word lines each connected with corresponding ones of said plurality of memory cells; and
an additional data line formed on said semiconductor substrate to extend adjacent to and in parallel with a data line pair in said predetermined plurality of data line pairs which is disposed at an end of said memory array, said additional data line being permanently decoupled from reading and writing circuits which are coupled to said memory array, thereby to decrease the difference between the stray capacitances connected to the data lines constituting said data line pair disposed at an end of said memory array, respectively.

2. A dynamic RAM integrated circuit device having a folded bit line arrangement as defined in claim 1, wherein said additional data line is formed from the same wiring layer as each of said plurality of data line pairs.

3. A dynamic RAM integrated circuit device having a folded bit line arrangement as defined in claim 2, further comprising another additional data line formed on said semiconductor substrate to extend adjacently to and in parallel with said additional data line to form an additional data line pair at said end of said memory array, said another additional data line also being permanently decoupled from reading and writing circuits which are coupled to said memory array.

4. A dynamic RAM integrated circuit device having a folded bit line arrangement as defined in claim 3, wherein the distance between the additional data lines constituting said additional data line pair is made substantially equal to the distance between the data lines constituting each of said plurality of data line pairs and wherein the distance between the data line disposed at said end part of said memory array and one of the additional data lines constituting said additional data line pair disposed adjacently thereto is made substantially equal to that between adjacent ones of said plurality of data line pairs.

5. A dynamic RAM integrated circuit device having a folded bit line arrangement as defined in claim 4, wherein each of the additional data lines constituting said additional data line pair is connected with circuit elements substantially equivalent to those connected to each data line of said plurality of data line pairs, thereby allowing the parasitic capacitance connected to each of the additional data lines constituting said additional data line pair to be substantially equal to that connected to each data line of said plurality of data line pairs.

6. A dynamic RAM integrated circuit device having a folded bit line arrangement as defined in claim 1, wherein each of said plurality of word lines crosses each of said plurality of data line pairs and said additional data line.

7. A dynamic RAM integrated circuit device having a folded bit line arrangement as defined in claim 6, further comprising another additional data line formed on said semiconductor substrate to extend adjacently to and in parallel with said additional data line to form an additional data line pair at said end of said memory array, said another additional data line also being permanently decoupled from reading and writing circuits which are coupled to said memory array.

8. A dynamic RAM integrated circuit device having a folded bit line arrangement as defined in claim 7, wherein the distance between the additional data lines constituting said additional data line pair is made substantially equal to the distance between the data lines constituting each of said plurality of data line pairs and wherein the distance between the data line disposed at said end part of said memory array and one of the additional data lines constituting said additional data line pair disposed adjacently thereto is made substantially equal to that between adjacent ones of said plurality of data lines pairs.

9. A dynamic RAM integrated circuit device having a folded bit line arrangement as defined in claim 8, wherein each of the additional data lines constituting said additional data line pair is connected with circuit elements substantially equivalent to those connected to each data line of said plurality of data line pairs, thereby allowing the parasitic capacitance connected to each of the additional data lines constituting said additional data line pair to be substantially equal to that connected to each data line of said plurality of data line pairs.

10. A dynamic RAM integrated circuit device having a folded bit line arrangement as defined in claim 1, wherein said additional data line is connected with first terminals of corresponding ones of said plurality of memory cells which have second terminals connected with corresponding ones of said plurality of word lines.

11. A dynamic RAM integrated circuit device having a folded bit line arrangement as defined in claim 10, further comprising another additional data line formed on said semiconductor substrate to extend adjacently to and in parallel with said additional data line to form an additional data line pair at said end of said memory array, said another additional data line also being permanently decoupled from reading and writing circuits which are coupled to said memory array.

12. A dynamic RAM integrated circuit device having a folded bit line arrangement as defined in claim 11, wherein the distance between the additional data lines constituting said additional data line pair is made substantially equal to the distance between the data lines constituting each of said plurality of data line pairs and wherein the distance between the data line disposed at said end part of said memory array and one of the additional data lines constituting said additional data line pair disposed adjacently thereto is made substantially equal to that between adjacent ones of said plurality of data line pairs.

13. A dynamic RAM integrated circuit device having a folded bit line arrangement as defined in claim 12, wherein each of the additional data lines constituting said additional data line pair is connected with circuit elements substantially equivalent to those connected to each data line of said plurality of data line pairs, thereby allowing the parasitic capacitance connected to each of the additional data lines constituting said additional data line pair to be substantially equal to that connected to each data line of said plurality of data line pairs.

14. A dynamic RAM integrated circuit device having a folded bit line arrangement as defined in claim 1, wherein a distance between said additional data line and the data line disposed at an end part of said memory array is made substantially equal to a distance between the data lines constituting one of said plurality of data line pairs.

15. A dynamic RAM integrated circuit device having a folded bit line arrangement as defined in claim 1, wherein said additional data line is connected with circuit elements substantially equivalent to those connected to each data line of said plurality of data line pairs, thereby allowing the parasitic capacitance connected to said additional data line to be substantially equal to that connected to each data line of said plurality of data line pairs.

16. A dynamic RAM integrated circuit device having a folded bit line arrangement as defined in claim 15, wherein said circuit elements connected to said additional data line include circuit elements equivalent to those constituting a sense amplifier connected to each of said plurality of data line pairs and a transistor equivalent to that for forming a column switch for selecting one data line from said plurality of data line pairs.

17. A dynamic RAM integrated circuit device having a folded bit line arrangement as defined in claim 1, further comprising another additional data line formed on said semiconductor substrate to extend adjacently to and in parallel with said additional data line to form an additional data line pair at said end of said memory array, said another additional data line also being permanently decoupled from reading and writing circuits which are coupled to said memory array.

18. A dynamic RAM integrated circuit device having a folded bit line arrangement as defined in claim 17, wherein the distance between the additional data lines constituting said additional data line pair is made substantially equal to the distance between the data lines constituting each of said plurality of data line pairs and wherein the distance between the data line disposed at said end part of said memory array and one of the additional data lines constituting said additional data line pair disposed adjacently thereto is made substantially equal to that between adjacent ones of said plurality of data line pairs.

19. A dynamic RAM integrated circuit device having a folded bit line arrangement as defined in claim 18, wherein each of the additional data lines constituting said additional data line pair is connected with circuit elements substantially equivalent to those connected to each data line of said plurality of data line pairs, thereby allowing the parasitic capacitance connected to each of the additional data lines constituting said additional data line pair to be substantially equal to that connected to each data line of said plurality of data line pairs.

20. A dynamic RAM integrated circuit device comprising:
a memory array having a plurality of data lines, a plurality of memory cells connected to a corresponding one of said plurality of data lines and a plurality of word lines each connected to corresponding ones of said plurality of memory cells; and
means for selecting any data line from said plurality of data lines except for data lines disposed at end parts of said memory array respectively, thereby to substantially permanently prohibit the selection of said data lines disposed at end parts of said memory array respectively, to decrease the difference between the stray capacitances connected to pairs of data lines disposed respectively adjacent to the permanently non-selected data lines at the end parts of said memory circuit.

21. A dynamic RAM integrated circuit device having a folded bit line arrangement comprising:
a memory array having a predetermined plurality of data line pairs formed on a semiconductor substrate, a plurality of memory cells each connected with a corresponding one of said plurality of data line pairs and a plurality of word lines each connected with corresponding ones of said plurality of memory cells; and
a first additional data line formed on said semiconductor substrate to extend adjacent to and in parallel with a data line pair in said predetermined plurality of data line pairs which is disposed at a first end of said memory array, and a second additional data line formed on said semiconductor substrate to extend adjacent to and in parallel with a data line pair in said predetermined plurality of data line pairs which is disposed at a second end of said memory array opposite to said first end, wherein said first and second additional data lines are permanently decoupled from reading and writing circuits which are coupled to said memory array, thereby to decrease the difference between the stray capacitances connected to the lines constituting said data line pairs which are disposed at said first and second ends of said memory array respectively.

22. A dynamic RAM integrated circuit device having a folded bit line arrangement as defined in claim 21, further comprising:
a plurality of sense amplifiers, each of said sense amplifiers being coupled to a respective data line pair of said memory array in a manner to cancel common mode noise generated along each data line pair;
first and second dummy sense amplifiers, said first dummy sense amplifier being coupled to said first additional data line and said second dummy sense amplifier being coupled to said second additional data line; and
a column select circuit comprising a plurality of transistors respectively coupled to each of said data lines of said data line pairs, including means for coupling said plurality of transistors to reading and writing circuits for performing reading and writing operations in said memory array, and further comprising first and second transistors coupled, respectively, to said first and second additional data lines, wherein said first and second transistors are permanently decoupled from said reading and writing circuits.

23. A dynamic RAM integrated circuit device having a folded bit line arrangement comprising:

a memory array having a predetermined plurality of data line pairs formed on a semiconductor substrate, a plurality of memory cells each connected with a corresponding one of said plurality of data line pairs and a plurality of word lines each connected with corresponding ones of said plurality of memory cells; and a first additional data line pair formed on said semiconductor substrate to extend adjacent to and in parallel with a data line pair in said predetermined plurality of data line pairs which is disposed at a first end of said memory array, and a second additional data line pair formed on said semiconductor substrate to extend adjacent to and in parallel with a data line pair in said predetermined plurality of data line pairs which is disposed at a second end of said memory array opposite to said first end, wherein said first and second additional data line pairs are permanently decoupled from reading and writing circuits which are coupled to said memory array, thereby to decrease the difference between the stray capacitances connected to the lines constituting said data line pairs which are disposed at said first and second ends of said memory array respectively.

24. A dynamic RAM integrated circuit device having a folded bit line arrangement as defined in claim 23, further comprising:

a plurality of sense amplifiers, each of said amplifiers being coupled to a respective data line pair of said memory array in a manner to cancel common mode noise generated along each data line pair;

first and second dummy sense amplifiers, said first dummy sense amplifier being coupled to said first additional data line pair and said second dummy sense amplifier being coupled to said second additional data line pair; and a column select circuit comprising a plurality of transistors respectively coupled to each of said data lines of said data line pairs, including means for coupling said plurality of transistors to reading and writing circuits for performing reading and writing operations in said memory array, and further comprising first and second transistors coupled, respectively, to first and second data lines of said first additional data line pair, and third and fourth transistors coupled, respectively, to first and second data lines of said second additional data line pair, wherein control terminals of said first, second, third and fourth transistors are permanently held at a potential which prevents selection of said first and second additional data line pairs through said column select circuit.

* * * * *